United States Patent [19]
Pedersen et al.

[11] Patent Number: 5,376,844
[45] Date of Patent: * Dec. 27, 1994

[54] PROGRAMMABLE LOGIC DEVICE WITH MULTIPLEXER-BASED PROGRAMMABLE INTERCONNECTIONS

[75] Inventors: Bruce B. Pedersen; Richard G. Cliff, both of Santa Clara; Bahram Ahanin, Cupertino; Craig S. Lytle, Palo Alto; Francis B. Heile, Santa Clara; Kerry S. Veenstra, Concord, all of Calif.

[73] Assignee: Altera Corporation, San Jose, Calif.

[*] Notice: The portion of the term of this patent subsequent to Nov. 9, 2010 has been disclaimed.

[21] Appl. No.: 39,944

[22] Filed: Mar. 29, 1993

Related U.S. Application Data

[63] Continuation of Ser. No. 754,017, Sep. 3, 1991, Pat. No. 5,260,610.

[51] Int. Cl.⁵ .................................. H03K 19/177
[52] U.S. Cl. .................................. 326/41; 326/39
[58] Field of Search ............. 307/465, 465.1, 468, 307/469, 243; 340/825.83, 825.85, 825.87; 364/716

[56] References Cited

U.S. PATENT DOCUMENTS

| | | | |
|---|---|---|---|
| 3,473,160 | 10/1969 | Wahlstrom | 340/172.5 |
| 4,124,899 | 11/1978 | Birkner et al. | 364/716 |
| 4,398,267 | 8/1983 | Furuyama | 365/182 |
| 4,642,487 | 2/1987 | Carter | 307/465 |
| 4,706,216 | 11/1987 | Carter | 365/94 |
| 4,745,579 | 5/1988 | Mead et al. | 365/104 |
| 4,758,745 | 7/1988 | Elgamal et al. | 307/465 |
| 4,758,985 | 7/1988 | Carter | 365/94 |
| 4,786,904 | 11/1988 | Graham, III et al. | 340/825.830 |
| 4,818,988 | 4/1989 | Cooperman et al. | 340/825.85 |
| 4,855,619 | 8/1989 | Hsieh et al. | 307/443 |
| 4,870,302 | 9/1989 | Freeman | 307/465 |
| 4,873,459 | 10/1989 | El Gamal et al. | 307/465 |
| 4,879,481 | 11/1989 | Pathak et al. | 307/465 |
| 4,937,475 | 6/1990 | Rhodes et al. | 307/465 |
| 4,963,768 | 10/1990 | Agrawal et al. | 307/465 |
| 4,963,770 | 10/1990 | Keida | 307/465 |
| 5,027,011 | 6/1991 | Steele | 307/465 |
| 5,122,685 | 6/1992 | Chan et al. | 307/465.1 |
| 5,144,166 | 9/1992 | Camarota et al. | 307/465 |
| 5,204,556 | 4/1993 | Shankar | 307/465 |

FOREIGN PATENT DOCUMENTS

| | | | |
|---|---|---|---|
| 0081917 | 6/1988 | European Pat. Off. | H03K 17/62 |
| 0415542 | 3/1991 | European Pat. Off. | H03K 19/173 |
| 1444084 | 7/1976 | United Kingdom | |

OTHER PUBLICATIONS

R. C. Minnick, "A Survey of Microcellular Research", Journal of the Association for Computing Machinery, vol. 14, No. 2, pp. 203–241, Apr. 1967.

S. E. Wahlstrom, "Programmable Logic Arrays—Cheaper by the Millions", Electronics, Dec. 11, 1967, pp. 90–95.

Stephen S. Yau, "Universal Logic Modules and Their Applications", IEEE Transactions on Computers, vol. C–19, No. 2, Feb. 1970, pp. 141–149.

Richard G. Shoup, Programmable Cellular Logic Arrays (1970) (Ph.D. dissertation, Carnegie–Mellon University (Pittsburgh)).

Carr et al., *MOS/LSI Design and Application*, Texas Instruments Electronics Series, McGraw-Hill and Co., 1972, pp. 229–258.

(List continued on next page.)

*Primary Examiner*—Edward P. Westin
*Assistant Examiner*—Benjamin D. Driscoll
*Attorney, Agent, or Firm*—Robert R. Jackson; G. Victor Treyz

[57] ABSTRACT

A programmable logic array integrated circuit has a plurality of programmable logic elements grouped into a plurality of mutually exclusive groups. Each group includes signal conductors uniquely associated with that group for conveying signals between the programmable logic elements in that group. Other signal conductors are provided for conveying signals between the groups. Multiplexers can be used in various ways to reduce the number of programmable interconnections required between signal conductors.

23 Claims, 8 Drawing Sheets

OTHER PUBLICATIONS

F. Heutink, "Implications of Busing for Cellular Arrays", Computer Design, pp. 95–100, Nov., 1974.

H. Fleisher et al., "An Introduction to Array Logic", IBM Journal of Research and Development, Mar. 1975, pp. 98–109.

K. Horninger, "A High-Speed ESFI SOS Programmable Logic Array with an MNOS Version", IEEE Journal of Solid State Circuits, vol. SC$\propto$10, No. 5, Oct. 1975, pp. 331–336.

B. Kitson et al., "Programmable Logic Chip Rivals Gate Arrays in Flexibility", Electronic Design, Dec. 8, 1983, pp. 95–101.

Advanced Micro Devices, "The World's Most Versatile Logic Tool; AmPAL22V10", May 1984.

Monolithic Memories, "Programmable Array Logic; PAL 20RA10", Jun. 1984.

*The Programmable Gate Array Data Book*, Xilinx, Inc., San Jose, California, 1988.

A. Haines, "Field-Programmable Gate Array with Non-Volatile Configuration", Microprocessors and Microsystems, vol. 13, No. 5, Jun. 1989, pp. 305–312.

K. A. El-Ayat et al., "A CMOS Electrically Configurable Gate Array", IEEE Journal of Solid State Circuits, vol. 24, No. 3, Jun. 1989, pp. 752–762.

F. Furtek et al., "Labyrinth: A Homogeneous Computational Medium", Proc. IEEE 1990 Custom Integrated Circuits Conference, pp. 31.1.1–31.1.4.

H-C. Hsieh et al., "Third-Generation Architecture Boosts Speed and Density of Field-Programmable Gate Arrays", Proc. IEEE 1990 Custom Integrated Circuits Conference, pp. 31.2.1–31.2.7.

M. Ahrens et al., "An FPGA Family Optimized for High Densities and Reduced Routing Delay", Proc. IEEE 1990 Custom Integrated Circuits Conference, pp. 31.5.1–31.5.4.

*The Programmable Gate Array Data Book*, Xilinx, Inc., San Jose, California, 1991, pp. 1-3 through 1-5, pp. 2-1 through 2-13, and 2-61 through 2-69.

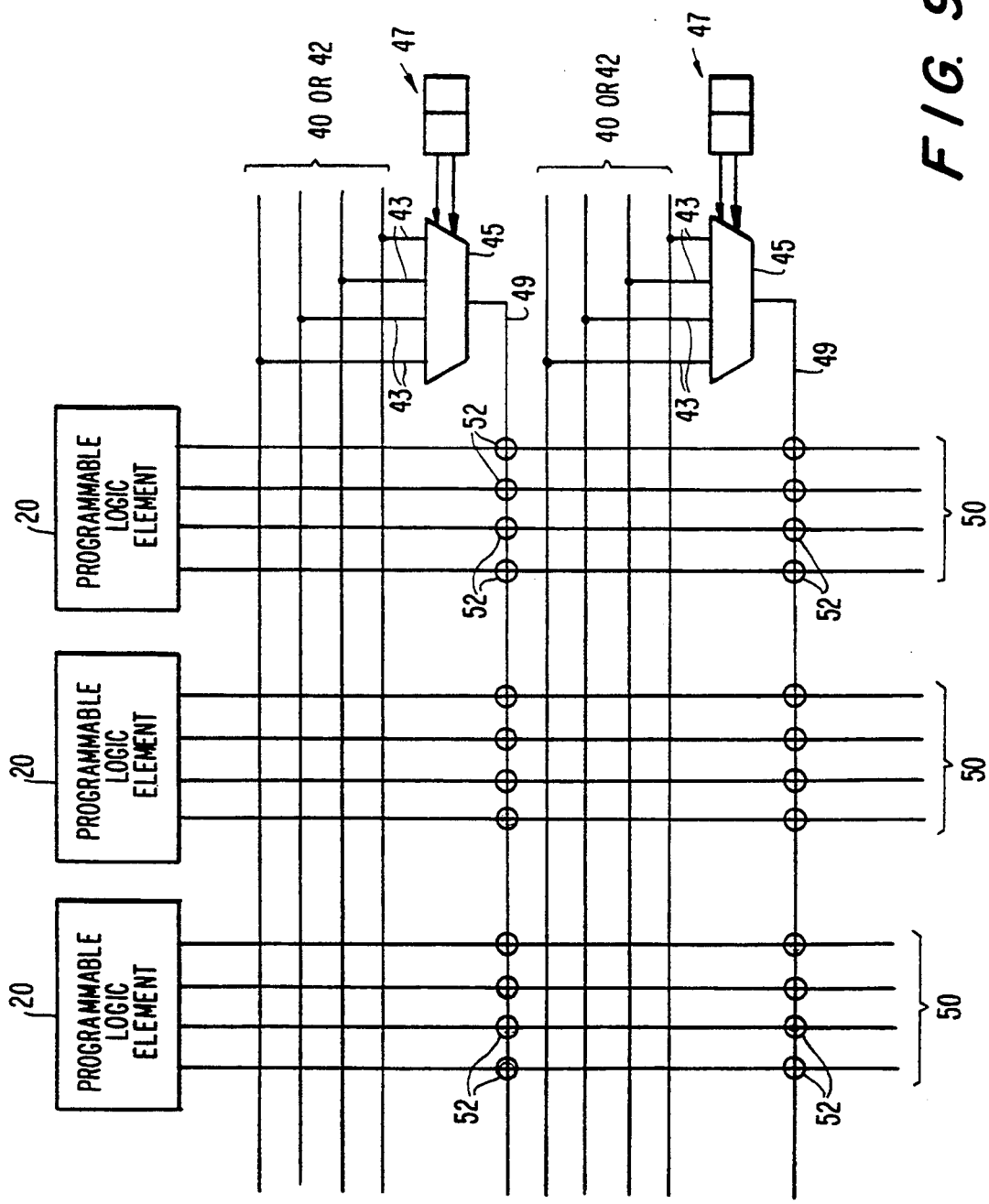

PROGRAMMABLE LOGIC DEVICE WITH MULTIPLEXER-BASED PROGRAMMABLE INTERCONNECTIONS

This is a continuation of application Ser. No. 07/754,017, filed Sep. 3, 1991, now U.S. Pat. No. 5,260,610 issued on Nov. 9, 1993, entitled PROGRAMMABLE LOGIC ARRAY INTEGRATED CIRCUITS.

BACKGROUND OF THE INVENTION

This invention relates to programmable logic array integrated circuits, and more particularly to programmable logic array integrated circuits with improved arrangements of the programmable logic elements and improved interconnections between those elements.

Programmable logic arrays are known in which substantial numbers of relatively elementary individual programmable logic elements are provided in a two-dimensional array. The array also includes a grid of intersecting signal conductors for conducting logic signals to, from, and between the programmable logic elements. Such programmable logic arrays are shown, for example, in Carter U.S. Pat. Nos. 4,642,487, 4,706,216, and 4,758,985, and in Freeman U.S. Pat. No. 4,870,302.

As integrated circuit fabrication techniques progress, it becomes possible to put more and more programmable logic elements on a chip. As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many such pathways that there is a wasteful excess of this type of resource. Similarly, as the number of programmable elements increases, the complexity of the logic which can be performed also increases. But this in turn tends to increase the complexity of the task of programming the circuit unless additional logical structure is included in the circuit to help correspondingly structure the programming task.

In view of the foregoing, it is an object of this invention to provide improved techniques for organizing and interconnecting the programmable logic elements in programmable logic array integrated circuits.

It is another object of this invention to provide improved programmable logic array integrated circuits.

SUMMARY OF THE INVENTION

These and other objects of the invention are accomplished in accordance with the principles of the invention by providing programmable logic array integrated circuits in which signal conductors are interconnected not by relatively large and complex programmable interconnections, but by relatively small and simple fixed interconnections to multiplexers which can then be programmed to effect the desired interconnections. Instead of having a signal conductor which crosses several other signal conductors programmably connectable to each of those other conductors by programmable elements at or near the intersection, a simple non-programmable transverse connection is made to each of those other conductors, and the transverse connections are applied in parallel to a multiplexer. The multiplexer can then be programmed to select one of its inputs as its output. The output of the multiplexer can be an input to a programmable logic element, an output from the integrated circuit, or a lead which is programmably connectable to one or more of several other conductors in the device.

Another interconnection technique which can be advantageously employed in accordance with the principles of this invention is to group the programmable logic elements into a plurality of mutually exclusive groups, each group having associated with it one or more conductors which can only be used to interconnect the elements in that group. In addition, there are other conductors which can be used to convey signals between the groups. Grouping the programmable logic elements in mutually exclusive (i.e., non-overlapping) groups helps to simplify the task of programming the device by breaking the device down into several discrete parts, each of which is smaller and more easily managed than the whole device. Providing signal conductors which serve only to interconnect the programmable logic elements in each group avoids tying up much longer conductors just to make short interconnections between adjacent programmable logic elements. This helps to reduce the required number of long conductors.

In the above-described arrangement in which the programmable logic elements are grouped and each group is uniquely associated with certain interconnection signal conductors, each programmable logic element may be augmented with a programmable output stage which can be used either to feed the output of that programmable logic element to conductors which go beyond the associated group or to the interconnect conductors of the associated group.

Multiplexers can also be used in combination with programmable signal conductor interconnections to allow certain of the conductors to be laid down more densely, to reduce the size of the interconnection array, and to reduce the capacitive loading on each output conductor of the array. Instead of one output conductor crossing a large number of parallel input conductors with a programmable interconnection at each intersection of the output conductor with the input conductors (which tends to force relatively wide spacing of the input conductors because of the relatively large size of the programmable interconnections), two substantially parallel output conductors feeding a programmably controlled output multiplexer are used. Each of these output conductors has a programmable interconnection only with every other one of the input conductors, and the input conductors which are thus connectable to one of the output conductors are interdigitated with the input conductors which are connectable to the other one of the output conductors. By thus spreading the programmable interconnections somewhat parallel to the longitudinal axes of the input conductors, the input conductors can be placed more closely together, which may save valuable space on the integrated circuit. This technique can also be used and further enhanced to reduce the number of programmable elements required to control the programmable interconnections between the input and output conductors if desired. In particular, a single programmable element can be used to control two interconnections, one of which is on one output conductor, and the other of which is on the other output conductor. The output multiplexer then makes the final selection of the desired output signal. Reducing the number of programmable elements in this way may be especially beneficial when the programmable elements are relatively large (e.g., as compared to the signal conductor interconnection elements they control). Indeed, it may be desirable to use more than two output signal conductors feeding the programmably controlled output multiplexer and to have each programmable element control one interconnection element on each of the more than two output conductors to still further reduce the required number of programmable elements.

Further features of the invention, its nature and various advantages will be more apparent from the accompanying drawings and the following detailed description of the preferred embodiments.

BRIEF DESCRIPTION OF THE DRAWINGS

FIGS. 5-9 are schematic diagrams showing alternative ways of making certain interconnections in circuits of the type shown in other drawings.

DETAILED DESCRIPTION OF THE PREFERRED EMBODIMENTS

Figure 1:
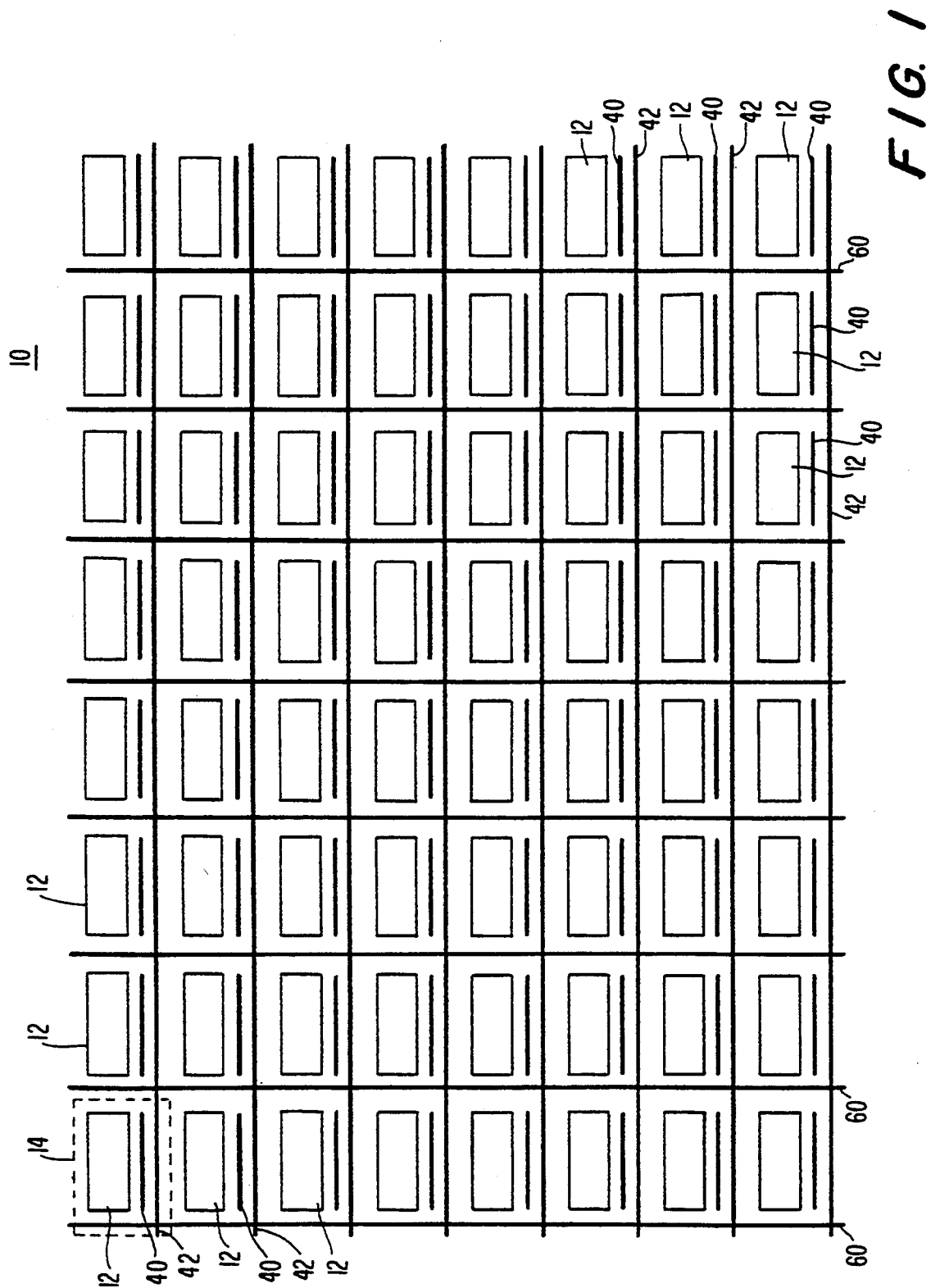
FIG. 1 is a simplified block diagram of a programmable logic array integrated circuit constructed in accordance with the principles of this invention.
Figure 2:
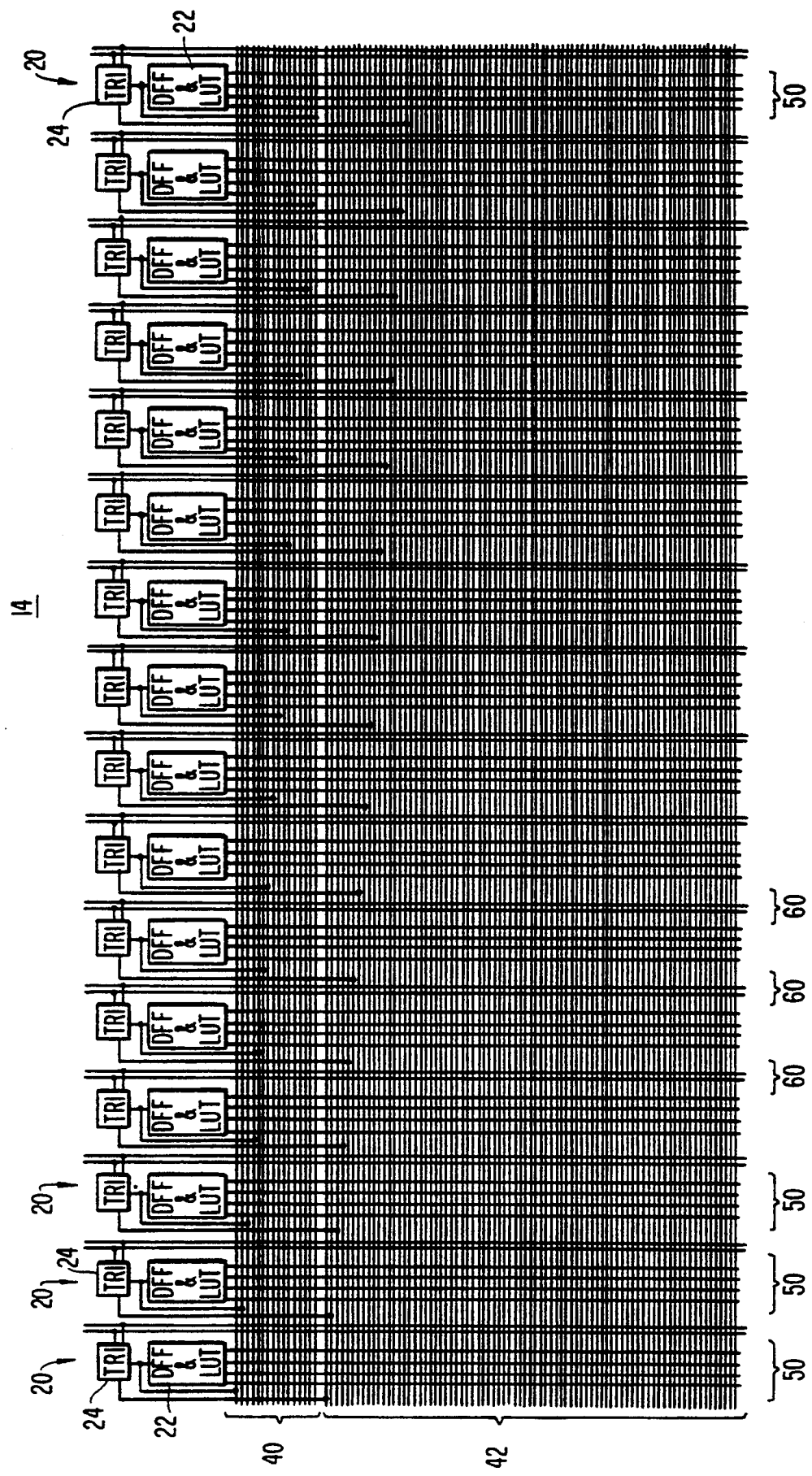
FIG. 2 is a more detailed block diagram of a representative portion of the circuit of FIG. 1.

As shown in FIG. 1, an illustrative programmable logic array integrated circuit 10 constructed in accordance with this invention includes a two-dimensional array of groups 12 of programmable logic elements. The representative portion of FIG. 1 which is surrounded by broken line 14 and which includes a typical group 12 is shown in more detail in FIG. 2. The structure shown in FIG. 2 is sometimes referred to herein as a logic array block or LAB. Accordingly, integrated circuit 10 (FIG. 1) is an eight by eight two-dimensional array of 64 LABs 14.

Figure 3:
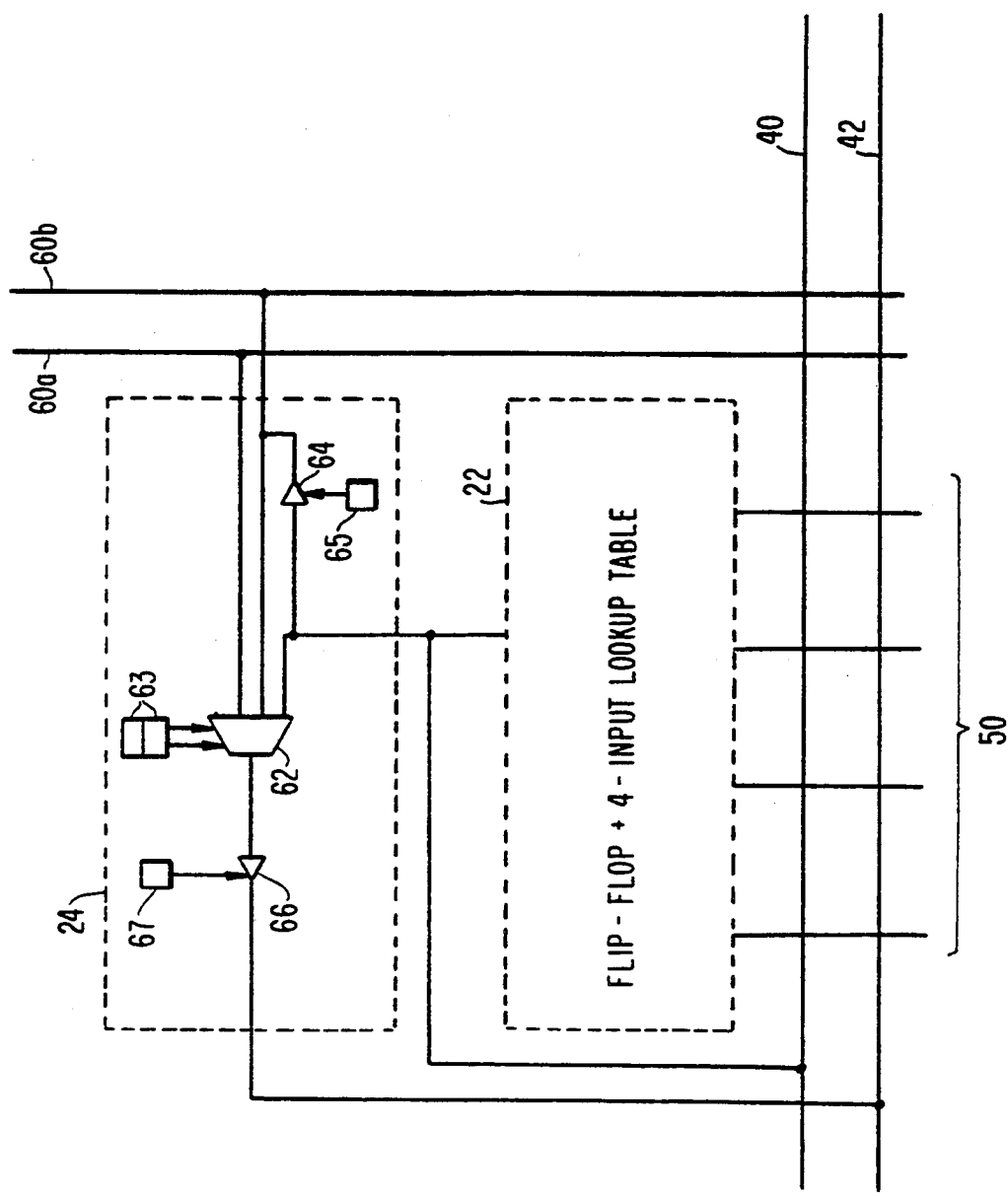
FIG. 3 is a still more detailed schematic block diagram of a representative portion of FIG. 2.
Figure 4:
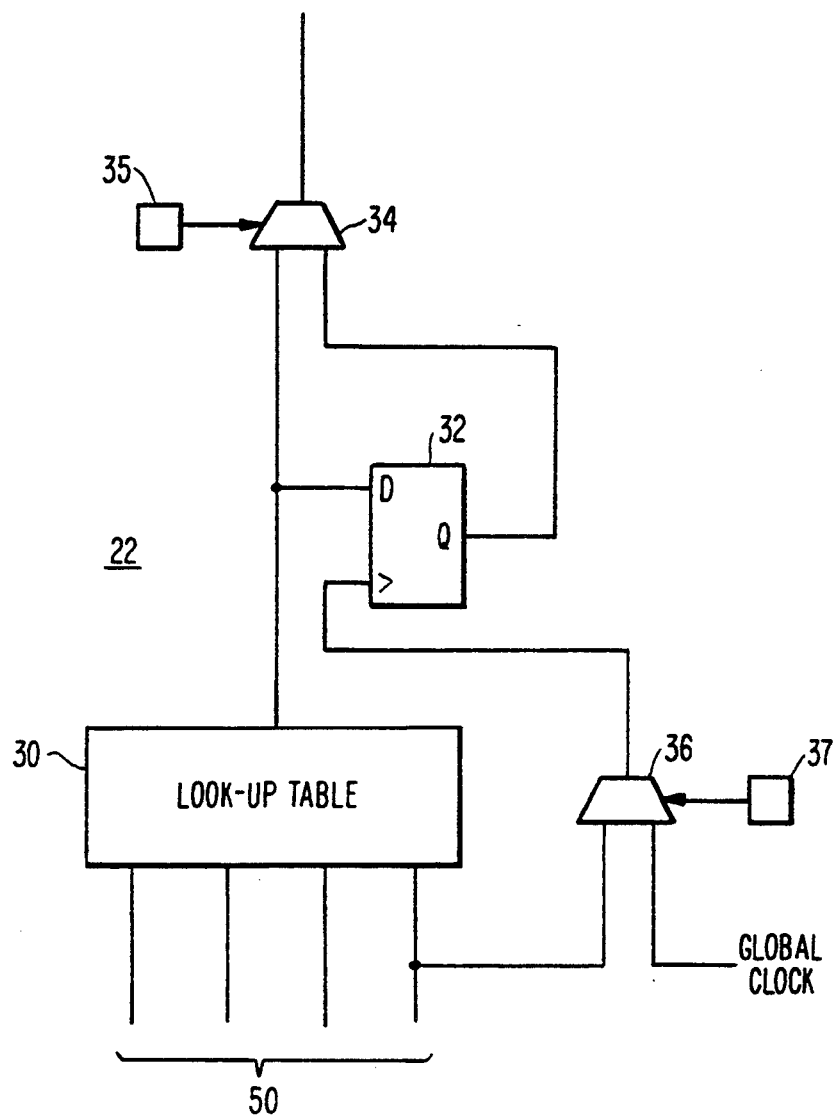
FIG. 4 is a schematic block diagram showing a portion of FIG. 3 in still more detail.

As can be seen in FIG. 2, each LAB 14 includes 16 programmable logic elements or macrocells 20, a representative one of which is shown in more detail in FIG. 3. In particular, although other types of logic elements could be used instead, in the illustrative embodiment shown in FIG. 3 each programmable logic element 20 includes a D-type flip-flop and four-input look-up table element 22 (shown in more detail in FIG. 4) and tri-state driver logic 24. As shown in FIG. 4, each element 22 includes a four-input look-up table 30 which is programmable to produce a desired binary output signal value for each of the 16 possible combinations of its four binary input signals. The output signal of look-up table 30 is applied to multiplexer 34 both directly and via D-type flip-flop 32. Flip-flop 32 can be clocked by either of the signals applied to multiplexer 36, i.e., by either a global clock signal or by one of the inputs to look-up table 30. Multiplexers 34 and 36 are controlled by conventional programmable elements 35 and 37 (e.g., RAM, EPROM, EEPROM, fuse, or antifuse elements).

Returning to FIG. 1, each LAB 14 has a plurality of signal conductors 40 (e.g., one for each of the programmable logic elements 20 in that LAB) which can be used to convey signals only between the programmable logic elements in that LAB (see also FIG. 2). Accordingly, the conductors 40 associated with each LAB are uniquely associated with that LAB and do not extend beyond that LAB. In addition, a plurality of signal conductors 42 is associated with each horizontal row of LABs 14. These signal conductors can be used to convey signals between LABs in the associated horizontal row of LABs. For example, 80 such conductors 42 may be provided for each horizontal row of LABs. This is less than the number of programmable logic elements in each horizontal row, so some of conductors 42 are connected to the outputs of two programmable logic elements.

In addition to the above-described horizontal signal conductors, there are two types of vertical signal conductors other than those which have already been discussed. The first of these provide the four inputs to the look-up table 30 in each programmable logic element 20. These conductors are not shown in FIG. 1, but are identified by the reference number 50 in the other FIGS. These conductors do not go outside the LAB of the associated programmable logic element. They allow the associated programmable logic element to receive input signals from the conductors 40 in the associated LAB and/or from the conductors 42 which pas through the associated LAB. Each conductor 50 may be programmably interconnectable to some or all of the horizontal conductors 40 and 42 that it crosses. Only one of the possible interconnections will generally be made at any one time.

Figure 6:
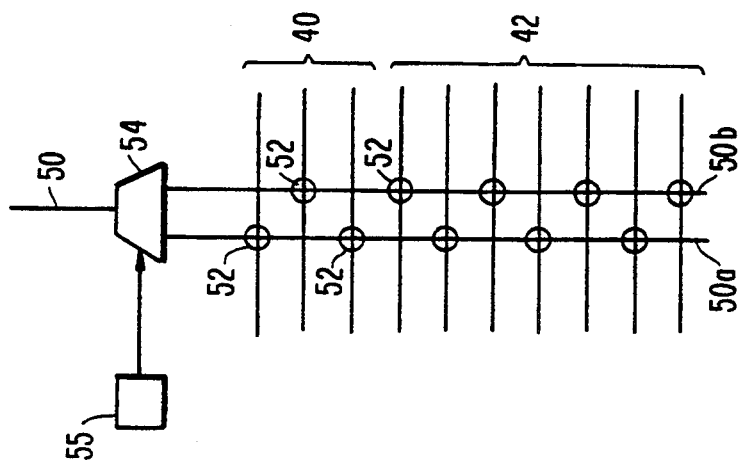
Figure 5:
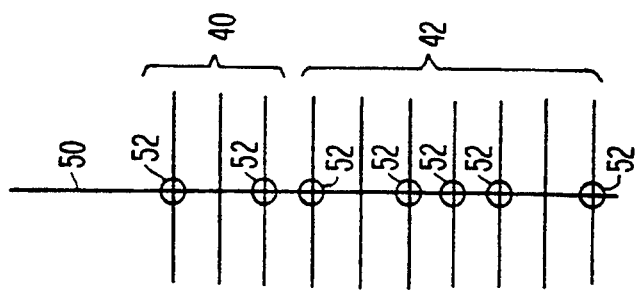
Figure 7:
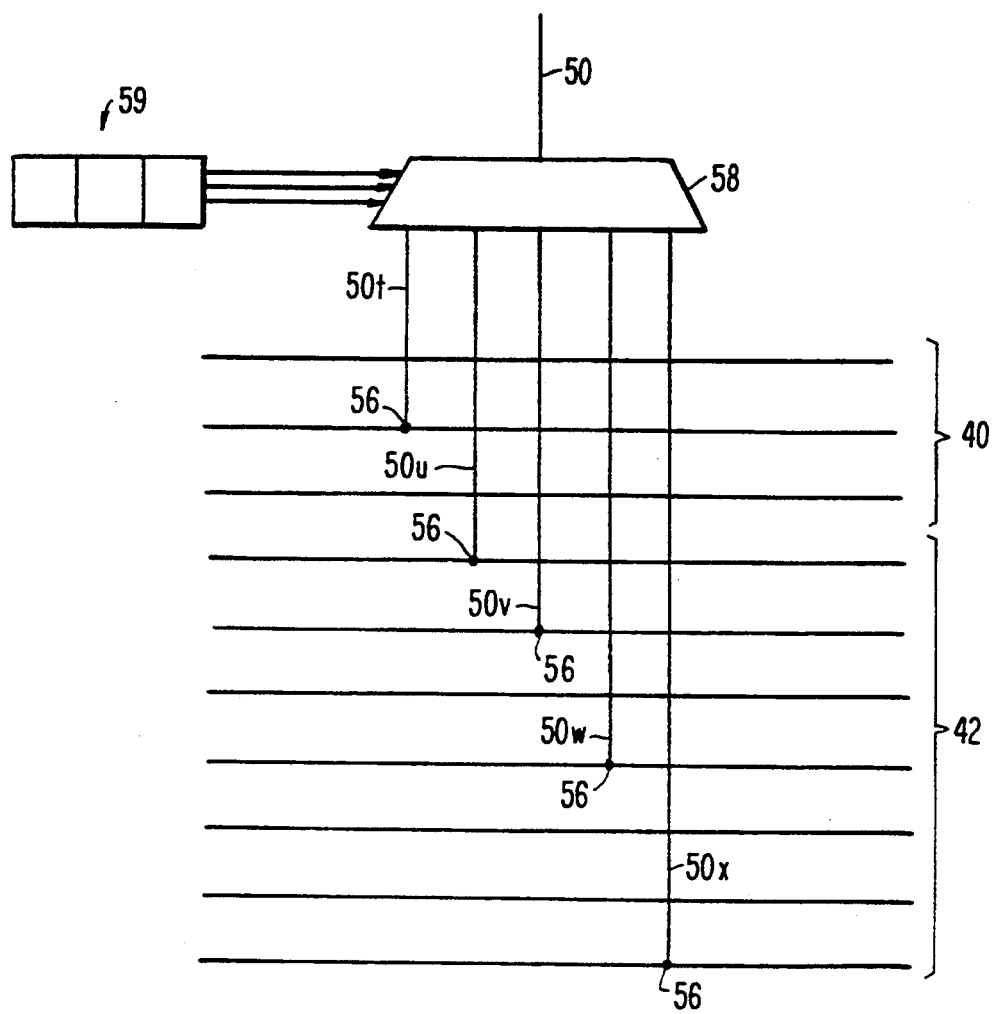

Conductors 50 can be configured in any of several ways. As shown in FIG. 5, for example, each conductor 50 can be a single line with programmable interconnections 52 to some or all of the horizontal conductors that it crosses. Alternatively as shown in FIG. 6, each conductor 50 can be the output signal of a multiplexer 54 which is fed by two (or more) conductors 50a and 50b. Each of conductors 50a and 50b has programmable interconnections 52 to a mutually exclusive subset of the input conductors crossed by 50a and 50b. These subsets are chosen so that no two adjacent input conductors 40 and 42 have programmable interconnections 52 to the same output conductors 50a and 50b. By thus spacing adjacent programmable interconnections parallel to the longitudinal axes of input conductors 40 and 42, it may be possible to place the input conductors closer together. This can be an important consideration given the large number of conductors on circuit 10. The capacitive loading on each of conductors 50a and 50b is less than it would be on a single conductor with the same total number of possible interconnections, thereby allowing faster operation of the device. Multiplexer 54 is controlled to connect one of its inputs 50a or 50b to its output 50 by programmable device 55. As another possible alternative shown in FIG. 7, each input conductor 40 and 42 which can be connected to output conductor 50 has a transverse branch conductor 50t through 50x connected to it by a fixed connection 56. These branch conductors are the inputs to a multiplexer 58 which can connect any one of its inputs to its output. Multiplexer 58 is controlled to make this connection by programmable elements 59. Fixed connections 56 can be made smaller than programmable interconnections, and they also reduce the load on input conductors 40 and 42 as compared to programmable interconnections such as 52 in FIGS. 5 and 6.

Figure 8:
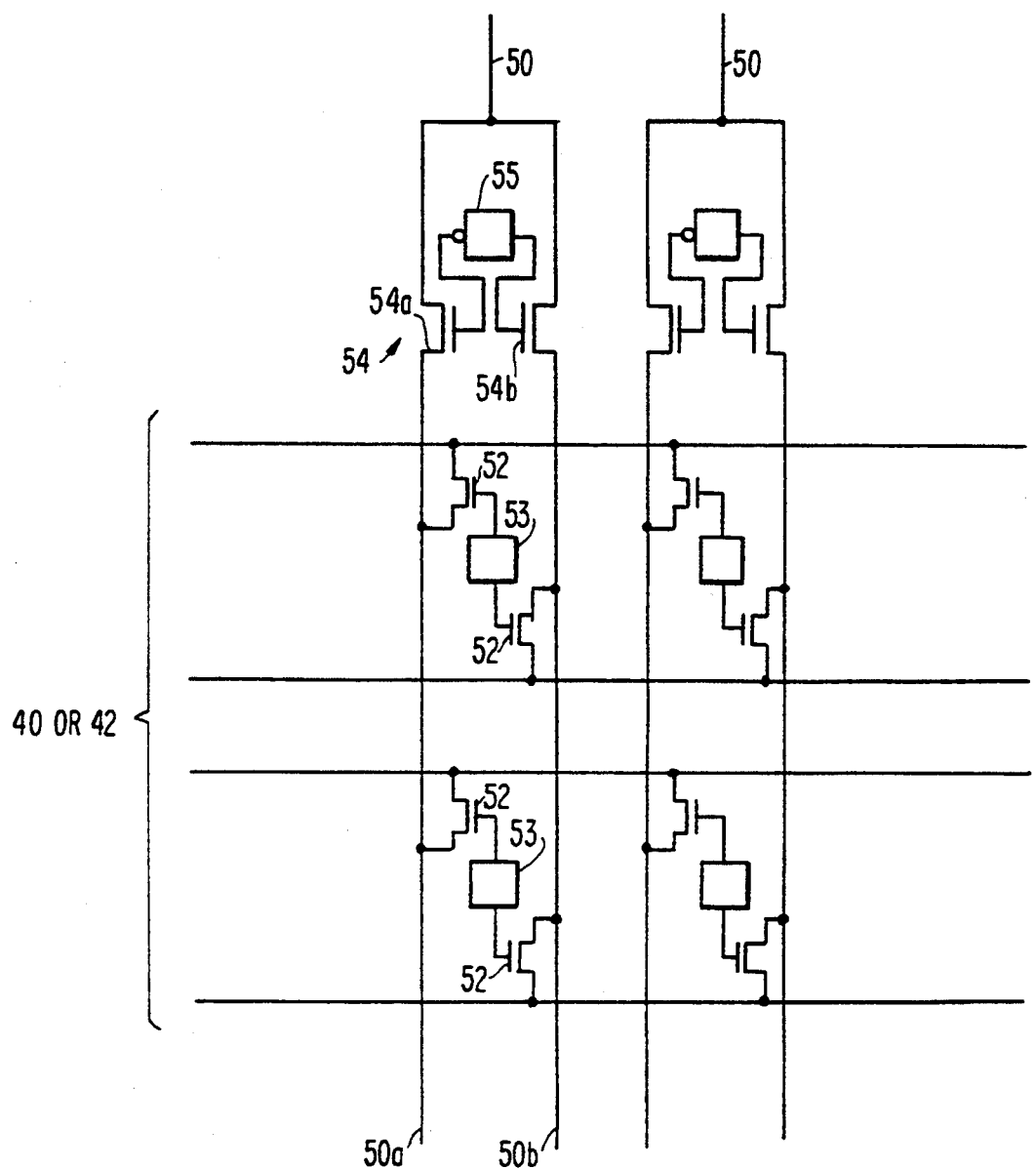

When the technique shown in FIG. 6 is used, the number of programmable elements required to control the interconnection elements can be dramatically reduced if desired by employing the enhancement shown in FIG. 8. In particular, one programmable element 53

(e.g., a conventional RAM cell) is used to control one interconnection element 52 associated with each of the two or more output conductors 50a and 50b feeding multiplexer 54. (In FIG. 8 multiplexer 54 is shown in more detail as including pass transistors 54a and 54b respectively controlled by the "true" and "complement" output signals of programmable element 55.) Thus when any programmable element 53 is programmed to make an input conductor to output conductor connection, two such connections are made. The final selection of the desired connection is made by multiplexer 54. As compared to embodiments in which each interconnection element is controlled by a separate programmable element, the required number of programmable elements is dramatically reduced (i.e., by nearly one-half) by employing the technique shown in FIG. 8. This can be especially important in the event that the programmable elements are relatively large (e.g., as compared to the interconnection elements) because significantly smaller interconnection arrays can be produced by reducing the number of programmable elements required in the array.

Although only two conductors 50a and 50b are shown feeding each multiplexer 54 in FIGS. 6 and 8, it will be understood that larger multiplexers fed by more than two conductors (e.g., four or eight conductors) can be used if desired in embodiments of the type shown in either of these FIGS. In the case of FIG. 8 type embodiments with more than two conductors feeding each multiplexer, each programmable element 53 can control one interconnection element 52 associated with each conductor feeding a multiplexer. This allows an even greater reduction in the required number of programmable elements.

Another technique which can be used in accordance with this invention to provide interconnections between input conductors such as 40 and 42 and output conductors such as 50 is shown in FIG. 9. Instead of providing large numbers of programmable interconnections where input conductors 40 and 42 intersect output conductors 50, each input conductor has a transverse branch 43 fixedly connected to it. Several of these transverse branches are grouped as inputs to multiplexers 45. Each of multiplexers 45 is controlled by associated programmable elements 47 to select one of its inputs as its output 49. Each multiplexer output conductor 49 is extended (as an additional input conductor) across output conductors 50 and has programmable interconnections 52 to some or all of those output conductors. The technique shown in FIG. 9 reduces the size of the grid of intersecting conductors 40, 42, and 50 by reducing the number of programmable interconnections 52 that are employed. It also reduces the loading on input conductors 40 and 42.

Although the techniques described above in connection with FIGS. 6-9 are illustrated in the context of the signal conductors connected to logic elements 20, it will be understood that these techniques are equally applicable anywhere a cross point switch type interconnection is required between first and second groups of conductors on an integrated circuit.

Returning to the description of the vertical conductors in FIGS. 1-3, the other type of vertical conductors are identified by the reference number 60 in the FIGS. These are the only vertical conductors that extend between the horizontal rows of LABs 14. As can be seen in FIG. 2 there are two conductors 60 associated with each programmable logic element position across the circuit. In other words, the left-most pair of conductors shown in FIG. 2 extend along the entire vertical dimension of circuit 10 and have the same relationship to the left-most programmable logic element in each horizontal row that they are shown to have in the representative LAB shown in FIG. 2.

The manner in which the two conductors 60 associated with each vertical column of programmable logic elements 20 are utilized is more apparent in FIG. 3. Conductor 60a is connected only to one input of multiplexer 62 in the tri-state driver 24 of representative programmable logic element 20. (In at least some other elements 20 in this vertical column, conductor 60a is instead connected in the manner shown for conductor 60b in FIG. 3.) Conductor 60b is connected both to an input of multiplexer 62 and the output of tri-state driver element 64. (In at least some other elements 20 in this vertical column, conductor 60b is instead connected in the manner shown for conductor 60a in FIG. 3.) Note that the remaining input to multiplexer 62 and the input to element 64 is the output of logic module 22. The output of multiplexer 62 is applied to tri-state driver element 66. The output of tri-state driver element 66 is connected to one of long horizontal conductors 42. The connection made by multiplexer 62 and whether each of elements 64 and 66 is on or off are controlled by programmable elements 63, 65, and 67.

From the foregoing it will be apparent that conductors 60 can be used to convey signals from one horizontal row of LABs 14 to another horizontal row. For example, a programmable logic element output signal applied to conductor 60b via element 64 in FIG. 3 can be output from the multiplexer 62 in any other vertically aligned programmable logic element (or elements) and thereby put on the horizontal conductor 42 to which that multiplexer output is connected. From that horizontal conductor 42 the signal can be picked up by any conductor 50 to which that horizontal conductor is connectable. Note that elements 62 and 66 can alternatively be used to apply the output signal of the associated logic module 22 to the associated long horizontal conductor 42 so that in addition to being available as an input to other programmable logic elements in the associated LAB (via the associated short horizontal line 40), that logic module output can also be made available for input to programmable logic elements in other LABs in the associated horizontal row. Tri-state driver module 24 allows the logic module output signal which is being used in this way to be simultaneously applied to one of conductors 60 via element 64. On the other hand, any tri-state driver module 24 which is not being used to apply the output signal of the associated logic module 22 to a long horizontal conductor 42 is free for use in connecting a vertical conductor 60a or 60b to that long horizontal conductor.

Inputs and outputs (not shown) to integrated circuit 10 can be connected in any desired manner (e.g., by connecting selected conductors 42 or 60 to input and/or output pads via suitable input and/or output drivers).

Grouping programmable logic elements 20 into mutually exclusive LAB groups, each with associated short horizontal conductors 40 for transferring data among the programmable logic elements in that group, not only helps to improve the organization of the circuit (thereby simplifying programming), but also greatly reduces the number of long conductors (e.g., 42) that are needed. This in turn saves valuable space on the circuit chip.

It will be understood that the foregoing is merely illustrative of the principles of this invention, and that various modifications can be made by those skilled in the art without departing from the scope and spirit of the invention. For example, the number of look-up table 22 inputs is arbitrary and can be made more or less than four if desired. Similarly, the number of programmable logic elements 20 per LAB is arbitrary and can be made more or less than 16 if desired. The number of LABs 14 on the chip is also arbitrary and can be made more or less than 64 if desired. The number of conductors 40, 42, and 60 can also be varied if desired.

What is claimed is:

1. In a programmable logic array having a plurality of programmable logic elements, each of which has at least one programmable logic element input lead and at least one programmable logic element output lead, means for selectively connecting said programmable logic element output leads to said programmable logic element input leads comprising:
   a plurality of conductors extending between said programmable logic elements;
   means for connecting said programmable logic element output leads to said conductors;
   a multiplexer having a plurality of multiplexer input leads and a multiplexer output lead for selectively connecting any one of its multiplexer input leads to its multiplexer output lead, each of said multiplexer input leads being connected with a fixed connection to a respective one of said conductors, said conductors being substantially parallel to one another adjacent said fixed connections, said fixed connections allowing said conductors to be spaced closer to one another than would be possible using a programmable interconnection between each of said multiplexer input leads and a respective one of said conductors; and
   means for selectively connecting said multiplexer output lead to any of a plurality of said programmable logic element input leads, wherein said conductors cross a plurality of said programmable logic element input leads without possibility of interconnection with those programmable logic element input leads, and wherein said means for selectively connecting comprises:
   a multiplexer output leads which crosses said plurality of programmable logic element input leads; and
   means for selectively connecting said multiplexer output lead to at least one of said plurality of programmable logic element input leads.

2. In a programmable logic array having a plurality of programmable logic elements, each of which has at least one programmable logic element input lead and at least one programmable logic element output lead, means for selectively connecting said programmable logic element output leads to said programmable logic element input leads comprising:
   a plurality of conductors extending between said programmable logic elements;
   means for connecting said programmable logic element output leads to said conductors;
   a multiplexer having a plurality of multiplexer input leads and a multiplexer output lead for selectively connecting any one of its multiplexer input leads to its multiplexer output lead, each of said multiplexer input leads being connected with a fixed connection to a respective one of said conductors, said conductors being substantially parallel to one another adjacent to said fixed connections, said fixed connections allowing said conductors to be spaced closer to one another than would be possible using a programmable interconnection between each of said multiplexer input leads and a respective one of said conductors; and
   means for selectively connecting said multiplexer output lead to any of a plurality of said programmable logic element input leads, wherein said means for selectively connecting said multiplexer output lead to each of at least some of said plurality of programmable logic element input leads comprises a programmable interconnection between said multiplexer output lead and at least one of said plurality of programmable logic element input leads.

3. A programmable logic array integrated circuit comprising:
   a plurality of logic modules, each of which has a plurality of inputs and at least one output for producing as said output a programmable logical function of said inputs, said logic modules being grouped in a plurality of logic array blocks, said blocks being disposed on said circuit in a two dimensional array including intersecting rows and columns of said blocks;
   a plurality of first conductors adjacent to each of said logic array blocks, the first conductors adjacent to each block being adjacent to the logic modules within said block for selectively applying the outputs of the logic modules in each block to the inputs of any of the logic modules in that block;
   a plurality of second conductors extending substantially parallel to a first dimension of said array, said second conductors being grouped in a plurality of groups, each of which is adjacent to a respective one of said rows of blocks, each second conductor in each of said groups of second conductors extending continuously past substantially all of the blocks in the adjacent row;
   means for selectively applying the outputs of the logic modules in a row to the second conductors in the group adjacent to said row;
   means for selectively applying the signals on the second conductors in each group to the inputs of the logic modules in the row adjacent to said group;
   a plurality of third conductors extending substantially parallel to a second dimension of said array, said third conductors being grouped in a plurality of groups, each of which is adjacent to a respective one of said columns of blocks, each third conductor in each of said groups of third conductors extending continuously past substantially all of the blocks in the adjacent column;
   means for selectively applying the outputs of the logic modules in each column to the third conductors in the group adjacent to said column; and
   means for selectively connecting said third conductors to said second conductors, wherein each of said logic modules comprises:
   flip-flop means for registering said output of said logic module; and
   means for selectively bypassing said flip-flop means so that said output of said logic module is also available unregistered.

4. The circuit defined in claim 3 wherein each of said logic modules comprises:

look up table means having a plurality of programmable stored values, each of which is a possible value of said output that can be provided in response to a respective one of the possible combinations of said inputs to said logic module; and means responsive to said inputs to said logic module for producing as said outputs from said logic module the stored value that corresponds to the respective combination of said inputs currently being applied to said logic module.

5. The circuit defined in claim 3 wherein said means for selectively bypassing said flip-flop means comprises:

a switch having two input terminals and an output terminal, a first of said input terminals being connected to an input of said flip-flop means, and a second of said input terminals being connected to an output of said flip-flop means; and programmable means for causing said switch to connect a selected one of its input terminals to its output terminal.

6. The circuit defined in claim 3 wherein said means for selectively applying the outputs of the logic modules in a row to the second conductors in the group adjacent to said row comprises:

tri-state driver means connected between the output of each logic module in said row and a respective one of the second conductors in the group adjacent to said row.

7. The circuit defined in claim 3 further comprising:

means for applying the output of each of the logic modules in a block to a respective one of the first conductors adjacent to that block;

a programmable logic connector connected between a plurality of said first conductors adjacent to each block and each input of the logic modules in that block; and programmable function control element means for controlling each programmable logic connector to select at least one of the first conductors connected to that programmable logic connector as a source for a signal applied to the logic module input connected to that programmable logic connector.

8. The circuit defined in claim 3 wherein said means for selectively applying the signals on the second conductors in each group to the inputs of the logic modules in the row adjacent to said group comprises:

a programmable logic connector connected between a plurality of the second conductors in said group and each input of the logic modules in said row; and programmable function control element means for controlling each programmable logic connector to select at least one of the second conductors connected to that programmable logic connector as a source for a signal applied to the logic module input connected to that programmable logic connector.

9. The circuit defined in claim 8 wherein each programmable logic connector is connected between less than all of said second conductors in said group and the logic module in said row adjacent to said group.

10. The circuit defined in claim 3 wherein said means for selectively applying the outputs of the logic modules in a column to the third conductors in the group adjacent to said column comprises:

tri-state driver means connected between the output of each logic module in said column and a respective one of the third conductors in the group adjacent to said column.

11. The circuit defined in claim 3 wherein said means for selectively connecting said third conductors to said second conductors comprises:

a switch connected between (1) the output of each logic module and a third conductor in the group of third conductors adjacent to the column of blocks including that logic module, and (2) a second conductor in the group of second conductors adjacent to the row of blocks including that logic module; and programmable function control element means for controlling each switch to select either the logic module output or the third conductor connected to that switch as the source of the signal applied to the second conductor connected to that switch.

12. A programmable logic array integrated circuit comprising:

a plurality of regions of programmable logic disposed on said circuit in a two-dimensional array, each of said regions of programmable logic having a plurality of data input terminals and at least one data output terminal, and each of said regions of programmable logic being programmable to perform any of a plurality of logic functions on input signals applied to the data input terminals in order to produce an output signal which is applied to the data output terminal;

a first plurality of signal conductors, each of which extends along a first of the two dimensions of said two-dimensional array, and each of which extends continuously without interruption past a first multiplicity of said regions of programmable logic which are spaced from one another in a direction along said first dimension;

a second plurality of signal conductors, each of which extends along a second of the two dimensions of said two-dimensional array, and each of which extends continuously without interruption past a second multiplicity of said regions of programmable logic which are spaced from one another in a direction along said second dimension; and a plurality of programmable switches each being connected to one of said first conductors for allowing said first conductors to be connected to at least one of a plurality of said second conductors to which each of said programmable switches is connected, each programmable switch being adjacent to a respective one of said regions of programmable logic and being usable to connect the first conductor to which that programmable switch is connected to a second conductor without preventing the adjacent region of programmable logic from being programmed to perform any of said plurality of logic functions, wherein each of said programmable switches comprises:

a first branch conductor permanently connected to the first conductor;

a plurality of second branch conductors each permanently connected to one of the second conductors; and a programmable link for allowing said first branch conductor to be connected to one of said second branch conductors, wherein the programmable link of each of said programmable switches is disposed on said circuit at a location distinct and separate from the permanent connections of said first and second branch conductors to the first and second conductors.

13. The apparatus defined in claim 12 wherein said two-dimensional array is bounded by a first pair of edges which are substantially perpendicular to said first dimension and by a second pair of edges which are substantially perpendicular to said second dimension, and wherein each of said first conductors extends continuously substantially the entire distance between said first pair of edges.

14. The apparatus defined claim 13 wherein each of said second conductors extends continuously substantially the entire distance between said second pair of edges.

15. The apparatus defined in claim 12 wherein said regions of programmable logic are arranged in a plurality of rows which are spaced from one another along said second dimension, and wherein said first conductors are disposed on said circuit in the spaces between adjacent rows.

16. The apparatus defined in claim 15 wherein some of said first conductors are disposed in the space between each adjacent pair of rows.

17. The apparatus defined in claim 15 wherein said regions of programmable logic are also arranged in a plurality of columns which are substantially perpendicular to said rows, said columns being spaced from one another along said first dimension, and wherein said second conductors are disposed on said circuit in the spaces between adjacent columns.

18. The apparatus defined in claim 17 wherein some of said second conductors are disposed in the space between each adjacent pair of columns.

19. The apparatus defined in claim 12 wherein the programmable link of each of said programmable switches is a programmable transistor switch.

20. The apparatus defined in claim 12 wherein said means for connecting the data input and output terminals of each of said regions of programmable logic to selected ones of said conductors comprises:
    means for allowing the data output terminal of each of said regions of programmable logic to be connected to an adjacent one of said first conductors and an adjacent one of said second conductors.

21. The apparatus defined in claim 12 wherein the programmable switch adjacent to each region of programmable logic can connect either an adjacent second conductor or the data output terminal of the adjacent region of programmable logic to an adjacent first conductor.

22. The apparatus defined in claim 12 wherein said means for connecting the data input and output terminals of each of said regions of programmable logic to selected ones of said conductors comprises:
    a tri-state driver in the connection between each of said data output terminals and the selected conductor.

23. The apparatus defined in claim 12 wherein each connection established by said means for connecting is established through a tri-state driver.

* * * * *

UNITED STATES PATENT AND TRADEMARK OFFICE
CERTIFICATE OF CORRECTION

PATENT NO. : 5,376,844
DATED : December 27, 1994
INVENTOR(S) : Pedersen et al.

It is certified that error appears in the above-indentified patent and that said Letters Patent is hereby corrected as shown below:

Column 4, line 22, "pas" should be --pass--.

Column 7, line 46, "leads" should be --lead--.

Column 9, line 7, "outputs" should be --output--.

Signed and Sealed this

Twenty-first Day of May, 1996

Attest:

BRUCE LEHMAN

Attesting Officer     Commissioner of Patents and Trademarks